US006498729B2

(12) United States Patent
Wong et al.

(10) Patent No.: US 6,498,729 B2
(45) Date of Patent: Dec. 24, 2002

(54) EXPANSION MODULE

(75) Inventors: Foo Luen Wong, Singapore (SG); Ting Yeow Hoong, Singapore (SG)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/784,804

(22) Filed: Feb. 15, 2001

(65) Prior Publication Data

US 2001/0019914 A1 Sep. 6, 2001

(30) Foreign Application Priority Data

Mar. 3, 2000 (SG) ........................................ 200001133

(51) Int. Cl.[7] .................................................. H05K 5/00

(52) U.S. Cl. ....................... 361/752; 361/807; 361/810; 361/754; 439/76.1; 439/259; 439/74; 211/41.7

(58) Field of Search ................................ 361/752, 753, 361/730, 735, 796, 797, 754, 801, 825, 679, 714, 715, 724, 732, 747, 756, 759, 728, 790, 802, 686, 807–810; 211/41.17; 439/76.1, 74, 259

(56) References Cited

U.S. PATENT DOCUMENTS 5,337,220 A * 8/1994 Granitz ....................... 361/816
6,222,726 B1 * 4/2001 Cha ........................... 361/683

OTHER PUBLICATIONS

U.S. patent application Ser. No. 09/354,235, Wong et al., filed Jul. 16, 1999.

* cited by examiner

*Primary Examiner*—David Martin
*Assistant Examiner*—Hung Bui

(57) ABSTRACT

A computing device with an expansion module that may be removed and replaced in an expansion slot is disclosed. The computing device includes computer circuitry to which the expansion module may be electrically connected by means of electrical connectors. The expansion module is coupled to a removable portion of the housing so that when said portion is swung open with assistance of mechanical force, the expansion module is simultaneously disengaged from the computer circuitry. Thereafter, the expansion module can be further removed from said portion.

6 Claims, 6 Drawing Sheets

EXPANSION MODULE

FIELD OF INVENTION

This invention relates to a computing device with an expansion module.

BACKGROUND OF THE INVENTION

It is well known that the performance of a computer may be enhanced by the use of expansion modules. Known expansion modules, or boards, may, for example, increase the memory or improve the sound or video capabilities of a computer. The computer will typically receive and accommodate the expansion module in one or more available expansion slots. However, it is also common, as in the case of memory expansion, for an existing module in an expansion slot to be replaced by an expansion module with improved performance. Memory expansion can include both increasing the size of Random Access Memory (RAM) and upgrading information or program code on Read Only Memory (ROM).

Desktop computers typically have expansion slots located within the main casing of the computer. In general, the computer casing has to be opened up before a new expansion module can be added. Portable computers tend to be less expandable than their desktop counterparts. This is usually due to the limited space available within the computer casing.

A known laptop computer, the OmniBook® 5500CT (available from Hewlett-Packard, USA), includes two memory slots that accommodate two memory expansion boards. To add a new memory board, a user initially removes a cover portion of the housing from the memory expansion slot. If a memory expansion board is already present, then it may be pulled out by the user. The user then positions the new memory board over the two connectors in the slot and presses down on the board until it seats fully.

A drawback with the expansion slot in the OmniBook® computer is that the expansion module is prone to damage. Firstly, the memory board contains memory chips that can be damaged by electrostatic discharge caused by manual handling. Secondly, applying manual pressure directly on the memory board when it is pushed into place can cause the board to crack. The user may not realize that the memory board is seated fully and may further increase pressure on the board in an attempt to position it properly. Thirdly, a user may attempt to position the new memory board in an incorrect orientation in the expansion slot that can result in damage to the connectors and the memory chips.

A known handheld computer, the HP 340LX (available from Hewlett-Packard, USA), uses a ROM chip to store the operating system code. When it is desired to upgrade the operating system, the user simply removes a cover portion from the front of the computer, slides out a circuit board module with the old ROM chip, and replaces it by sliding in a new expansion module with an upgraded ROM chip. Like the OmniBook® expansion module, the expansion module for the HP 340LX is also prone to damage from manual handling during insertion.

A solution to the preceding problems is provided in a pending US patent application entitled "Expansion Module" with the serial number of 09/354,235, assigned to the current assignee. According to this patent application, the expansion module is coupled to a removable portion of the housing so that when the housing portion is replaced, the expansion module is simultaneously received in the expansion slot. The housing portion may then be slid laterally to a locking position. Nonetheless, in this patent application, the user needs to remove the keyboard and unfasten three screws that secure the keyboard located at the bottom of the case in order to get access to the expansion mode. This procedure makes the replacement inconvenient.

Therefore, there exists a need for a more convenient way to realize the replacement of expansion modules without enhancing the risk of damage to the module.

SUMMARY OF THE INVENTION

In a preferred embodiment, the invention provides a computing device with an expansion module that may be removed and replaced by a user with ease and with less risk of damage to the module. The computing device includes computer circuitry to which the expansion module may be electrically connected. Both the computer circuitry and the expansion module include electrical connectors, which when mated provide the electrical connection.

An embodiment of a computing device includes a computer circuitry, an expansion module, and a housing substantially enclosing the computer circuitry. Both the computer circuitry and the expansion module have a respective electrical connector for electrically connecting to each other. The housing has a housing cover that is removable from and replaceable on the reminder of the housing. The housing cover is coupled to the expansion module so that removal of the housing cover simultaneously separates the expansion module from the computer circuit, and replacement of the housing cover connects the two respective electrical connectors. With assistance of mechanical force, the housing cover can be swung open. This action causes the two electrical connectors to separate from each other. Thereafter, the expansion module can be further removed from the housing cover.

Preferably, friction between the two electrical connectors keeps them connected. The mating of the two connectors may further prevent movement of the expansion module. The housing cover is also restricted from movement when the expansion module is secured to the housing cover.

In a preferred embodiment of the invention, the computer device also has a locking means to provide the mechanical assistance for the removal and replacement of the housing cover. The locking means has a rear portion and a front portion, and is removable in a predetermined direction relative to the housing. A part of the housing cover is locked between the two portions. Furthermore, the locking means has a driven means through which the locking means is driven to move in the predetermined direction. When the locking means moves in a removal direction, the rear portion pushes the housing cover so that the housing cover is swung open. This action causes the two electrical connectors to separate from each other, either in partial or complete disengagement. The expansion module can be further detached from the computer circuitry by simply lifting the housing cover up. When the user wants to secure the expansion module, the locking means is driven in a replacement direction opposite to the removal direction. The front portion pushes the housing cover and the housing cover is driven back so that the two electrical connectors are connected and the expansion module is secured. Moreover, the locking means restricts the housing cover from movement when the expansion module is secured.

DETAILED DESCRIPTION OF A PREFERRED EMBODIMENT

Figure 1:
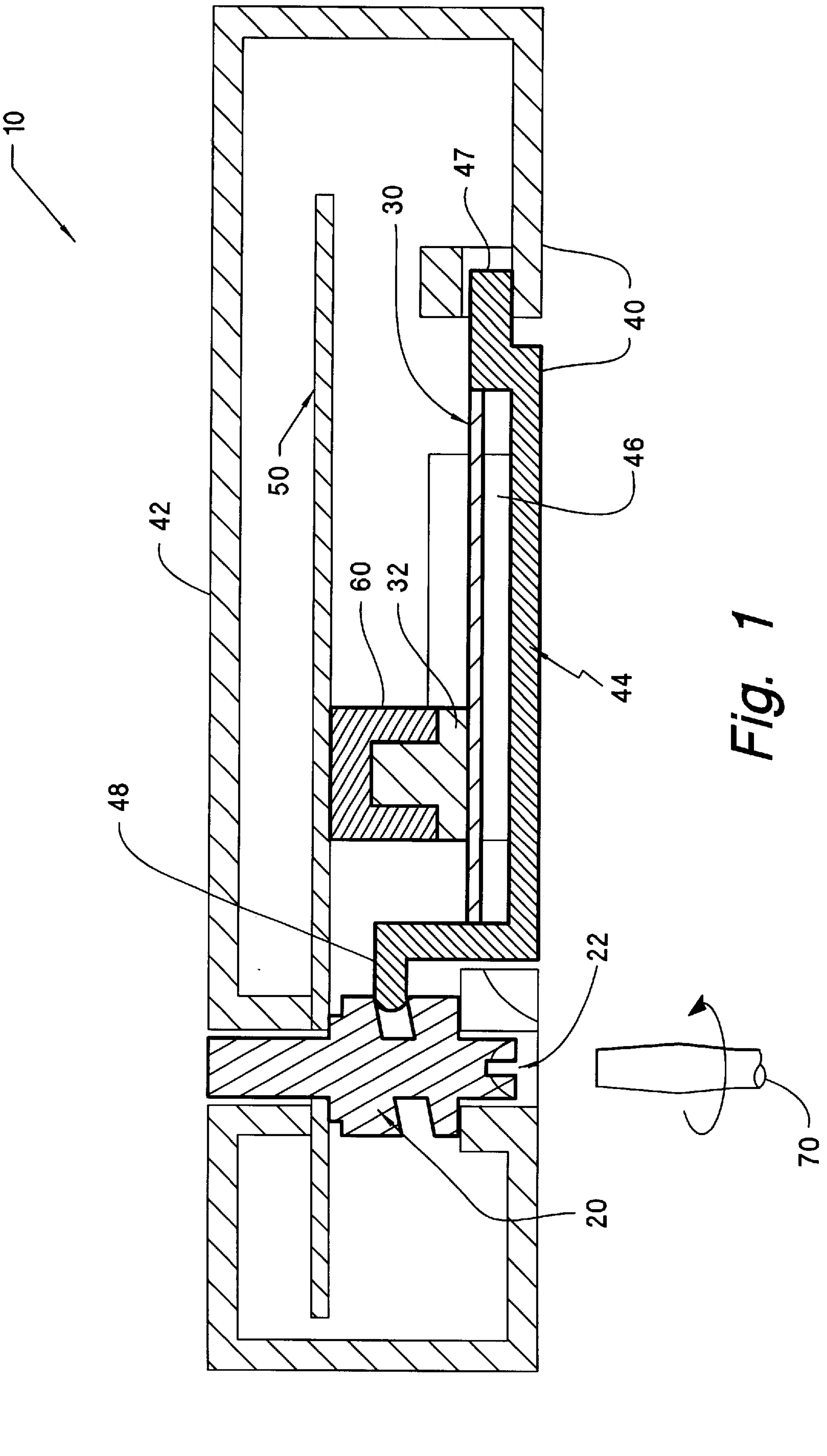
FIG. 1 is a schematic cross-section of a computing device in accordance with the invention, with a housing cover and an expansion module in the secured position.

FIG. 1 shows a computer 10 with an expansion slot 12 for accommodating an expansion module 30. The computer 10 may be a handheld portable computer, and the expansion module 30 may be a RAM or ROM module.

The computer 10 has a generally rectangular housing 40, a mother board 50, and an expansion module 30. The housing 40 is made, for example, of a plastics material and encloses the mother board 50. The mother board 50 is in the form of a standard printed circuit board (PCB) on which a female electrical connector or receptacle 60 is mounted. Other electronic components are also mounted on the mother board 50, such as, for example, a central processor unit, a video display chip, and an input/output chip. The housing 40 includes a removable housing cover 44. At one end of the housing cover 44, the housing cover 44 incorporates two tabs 47 which are tucked under a main body portion 42 of the housing 40 (see FIG. 4). The other end of the housing cover is movable.

The removable housing cover 44 is coupled to the expansion module 30 such that the expansion module 30 lies adjacent the major underside surface of the housing cover 44. The expansion module 30 has a male electrical connector or connector plug 32 mounted on a surface which faces away from the housing cover 44 in the coupled state.

As shown in FIG. 1, when the housing cover 44 is secured, the connector plug 32 is inserted into the receptacle 60 for electrically connecting the expansion module 30 to the mother board 50. Thus, replacement of the housing cover 44 simultaneously connects expansion module 30 with the mother board 50. Similarly, removal of the housing cover simultaneously separates the expansion module 30 from the mother board 50. As the housing cover 44 is swung open with assistance of mechanical force, the receptacle 60 and the connector plug are separated from each other, and the expansion module 30 can further be detached from the mother board 50.

Figure 3:
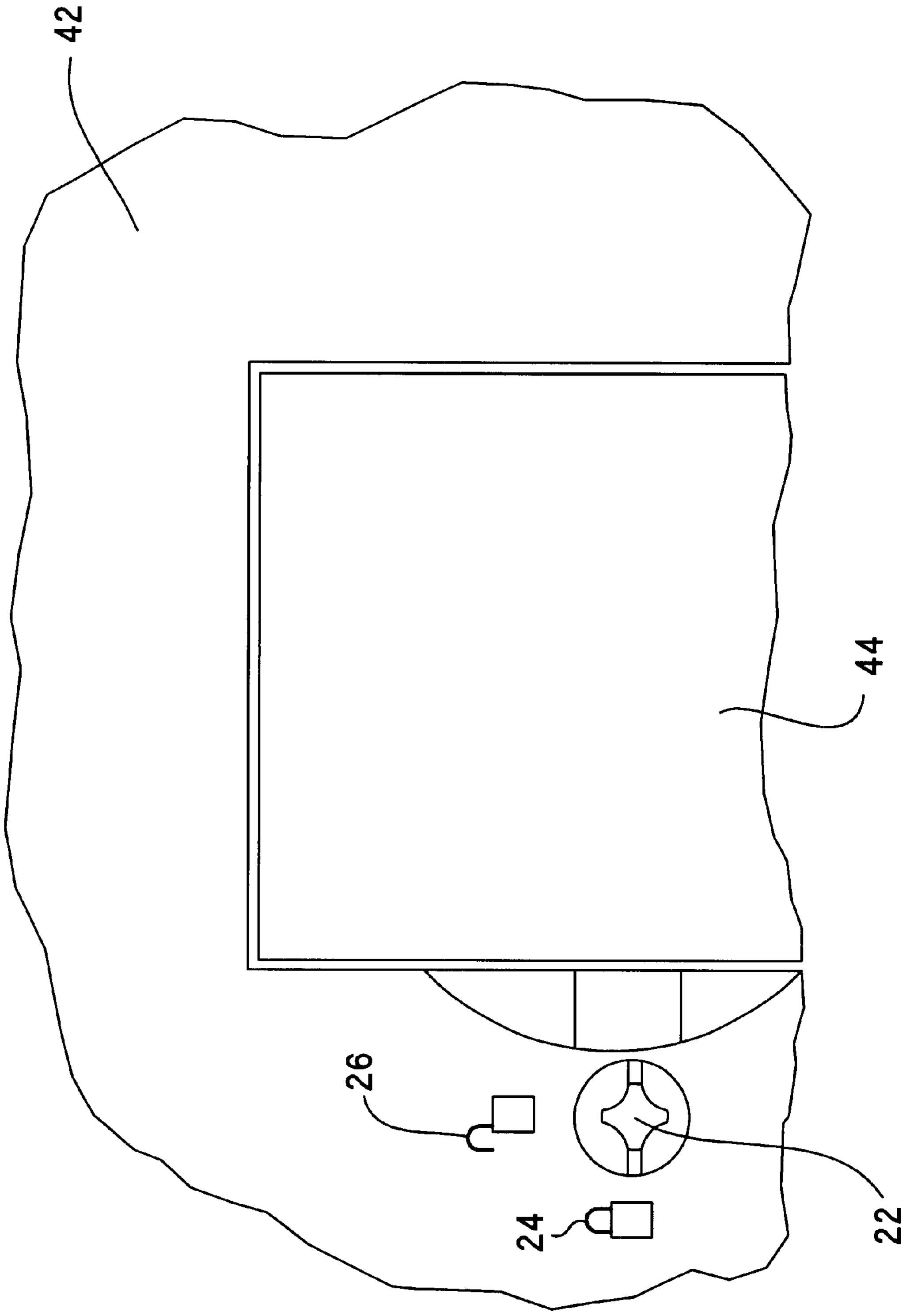
FIG. 3 is a plan view of the housing cover and a screw head being rotatable in two positions of "lock" and "unlock."

In a preferred embodiment, the mechanical force needed to open the housing cover 44 is provided by a cam 20 with a screw head 22. As shown in FIG. 3, the screw head 22 can be rotated between two positions: a "lock" position 24 and an "unlock" position 26. When the screw head 22 is rotated to the "unlock" position, the housing cover 44 can be detached from the main body portion 42. For securing the housing cover 44, the screw head 22 is rotated to the "lock" position.

Figure 2:
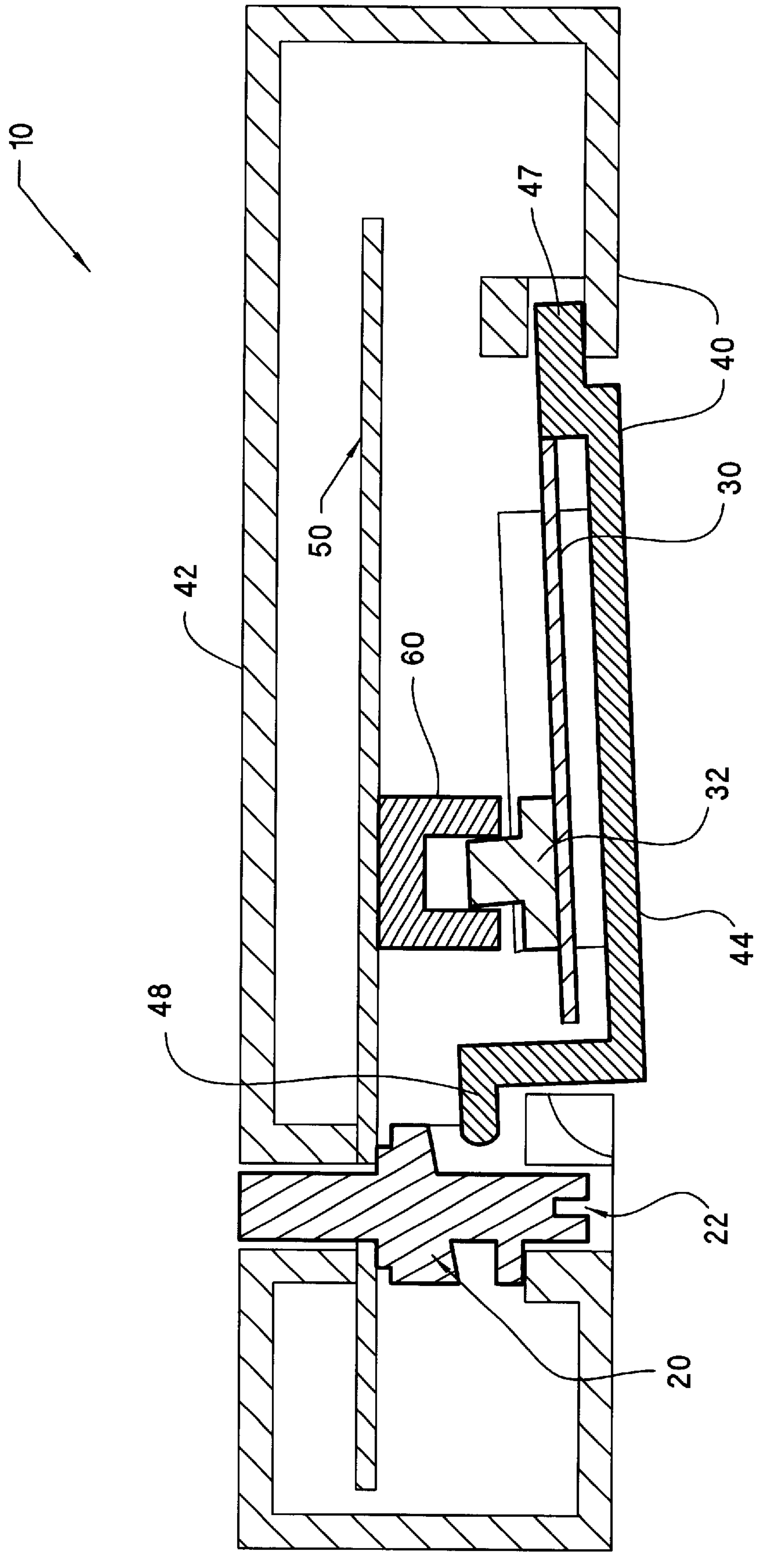
FIG. 2 is a schematic cross-section similar to FIG. 1 but with the housing cover in an unlocked position and the expansion module partially disengaged from a receptacle.

Typically, the cam 20 has a helical profile, and a cam follower's profile 48 is incorporated in the housing cover 44. As the cam 20 is being rotated from the "lock" position 24 to the "unlock" position 26, e.g., by a normal screw driver 70, the helical profile of the cam 20 pushes the housing cover 44 out. Thereby, the connector plug 32 disengages from its receptacle 60, either partially or completely (see FIG. 2). The cam's 20 profile also has an opening 28 (see FIG. 4). The opening 28 is positioned such that when the screw head 22 is rotated to the "unlock" position, the cam's 20 profile will not block further detachment of the housing cover 44. The expansion module 30 can be detached from the receptacle 60 by simply lifting the housing cover 44 up with a finger. After the housing cover 44 is fully lifted up, the expansion module 30 can then be replaced or a new expansion module can be coupled to the housing cover 44.

Likewise, when the expansion module 30 needs to be secured, the cam 20 is rotated from the "unlock" position 26 to the "lock" position. The housing cover 44 is thus pushed back by the cam's 20 profile. This action causes the connector plug 32 of the expansion module 30 to insert into the receptacle 60. The expansion module 30 is then electrically connected to the mother board 50, and the replacement of the expansion module is complete. The housing cover 4 is restricted from movement by the cam's profile after the expansion module 30 has been secured. Furthermore, friction between the connector plug 32 and the receptacle 60 keeps them connected. The mating of them also prevents movement of the expansion module 30.

Figure 4:
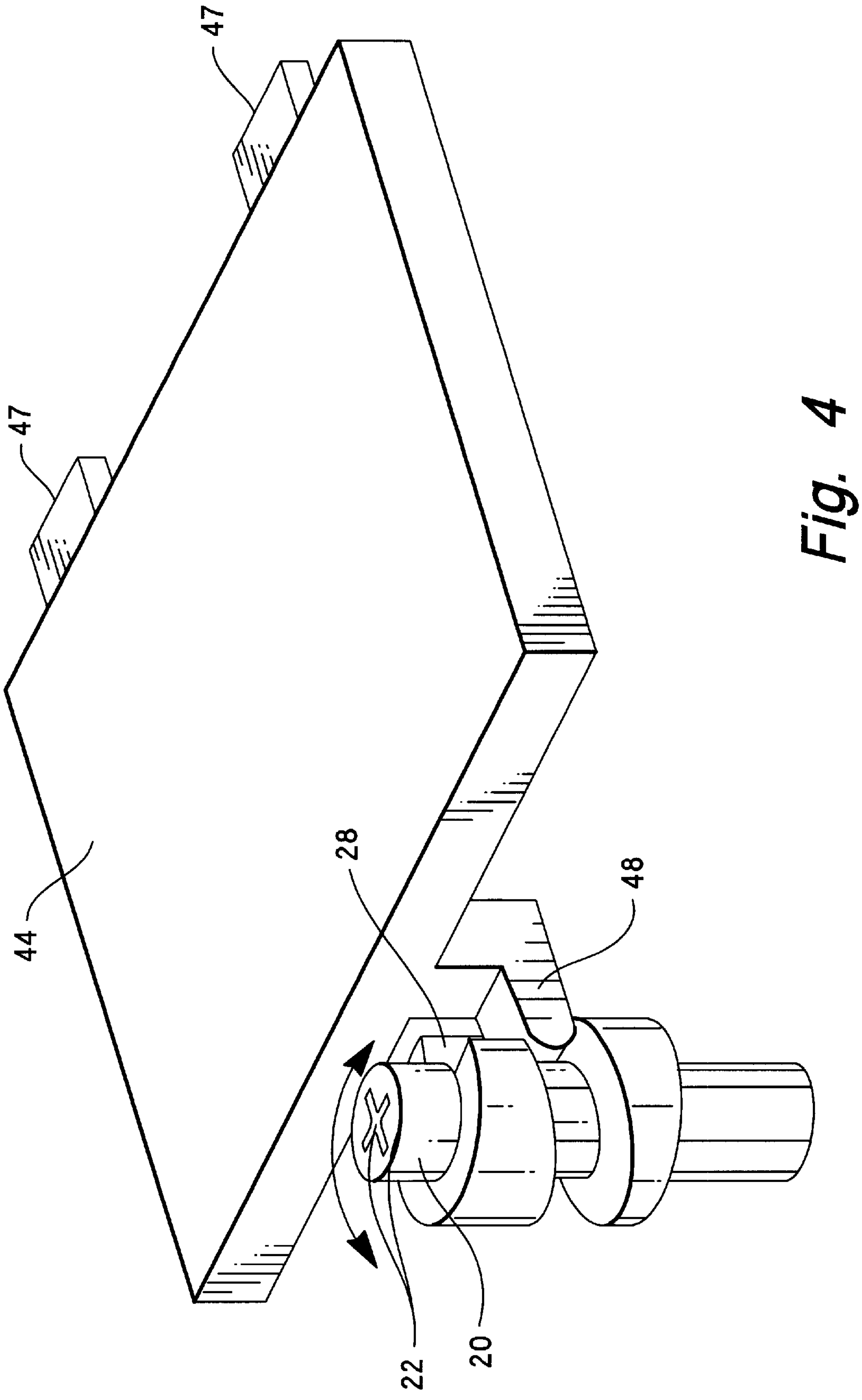
FIG. 4 is a perspective view of a cam with a screw head and the housing cover having the cam follower's profile incorporated.

FIG. 4 illustrates the interaction between the cam 20 and the housing cover 44. As shown in FIG. 4, the cam 20 has a screw head 22 such that the cam can be rotated by a normal screw driver. At one end of the housing cover 44, the housing cover 44 incorporates two tabs 47 which are tucked under the main body portion 42 of the housing 40 (see FIG. 1). The other end of the housing cover is movable, where a cam follower's profile 48 is incorporated in the housing cover 44. Thereby, the housing cover 44 can be pushed out or back by the cam's 20 profile when the cam 20 is rotated. Furthermore, the cam's 20 profile has an opening 28. When the screw head 22 is rotated to the "unlock" position, the cam's 20 profile will not block the further detachment of the housing cover 44.

Figure 5:
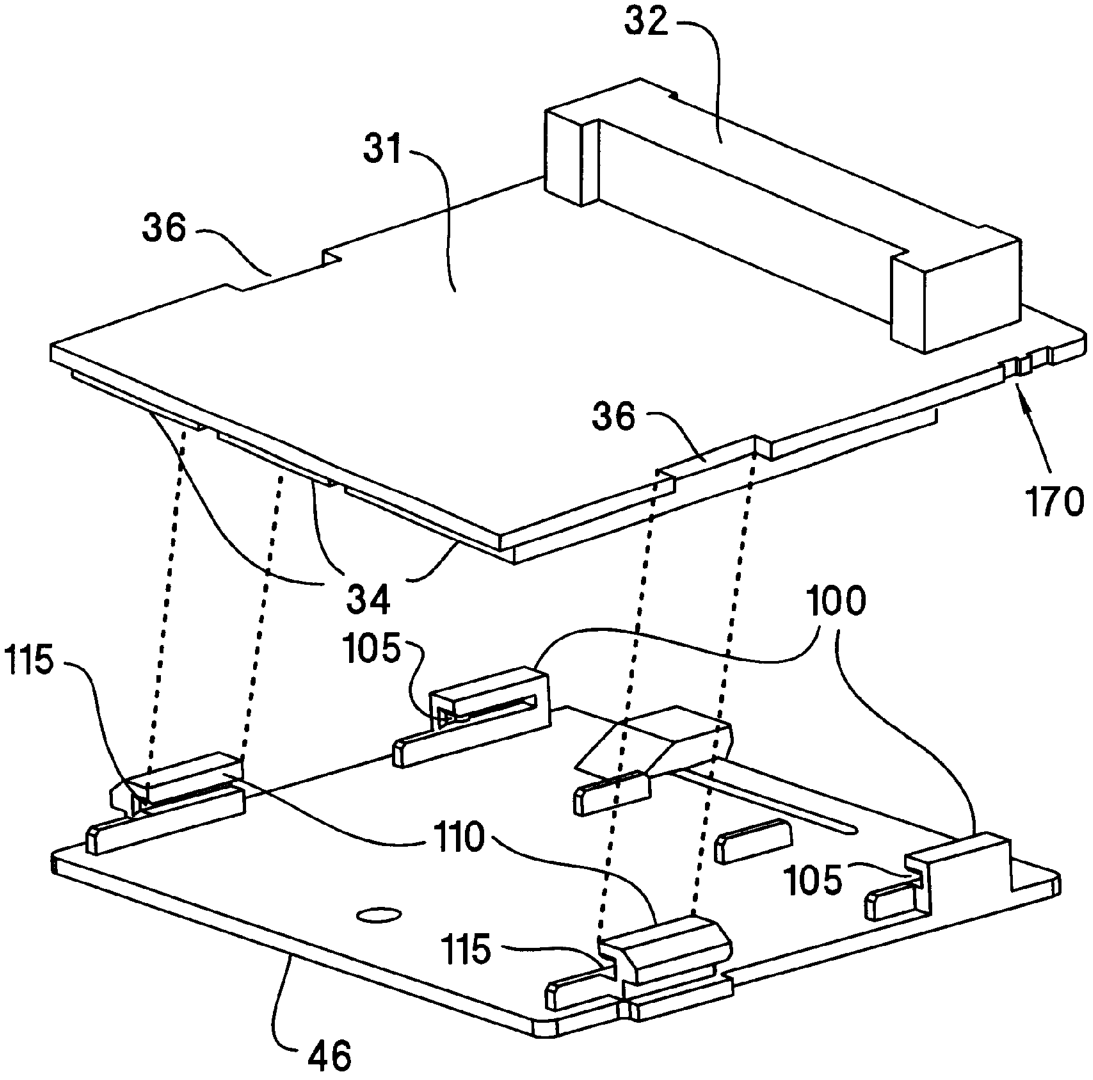
FIG. 5 is a perspective view of the housing cover and the expansion module in accordance with the invention.

FIG. 5 illustrates the detailed structure of the expansion module 30 and the housing cover 44 as in the preferred embodiment. The housing cover 44 and the expansion module 30 are generally planar and rectangular.

As shown in FIG. 5, the housing cover 44 has a pair of front arms 100 located towards the front of the housing cover 44 and a pair of rear arms 110 located towards the rear of the housing cover 44. All arms depend generally upwards from the upside of the housing cover 44. The front and rear arms 100, 110 are located on opposite sides of the housing cover 44; one front arm and one rear arm are located on the left-hand side of the housing cover, and the other front arm and rear arm are located on the right-hand side of the cover. Each arm in each pair is angled back towards the opposite arm in the pair to define a pair of front longitudinal channels 105 and a pair of rear longitudinal channels 115.

The expansion module 30 typically comprises a generally rectangular printed circuit board (PCB) 31 on which memory chips 34 and the electrical plug connector 32 are mounted. The dimensions of the PCB 31 are such that the left and right hand sides of the PCB 31 may be accommodated in the corresponding left and right sets of channels in the cover.

To couple the expansion module to the cover, the PCB 31 may be inserted into the pair of rear longitudinal channels 115 and slid forwards until it is received in the pair of front longitudinal channels 105. Alternatively, however, the housing cover 44 includes a pair of indents 36 on opposite sides of the PCB 31. These indents allow the PCB 31 to avoid the pair of rear arms 115, as shown by the dashed lines in FIG. 5. Thus, the PCB 31 may be slid into the front and rear longitudinal channels 105, 115 simultaneously.

Figure 6:
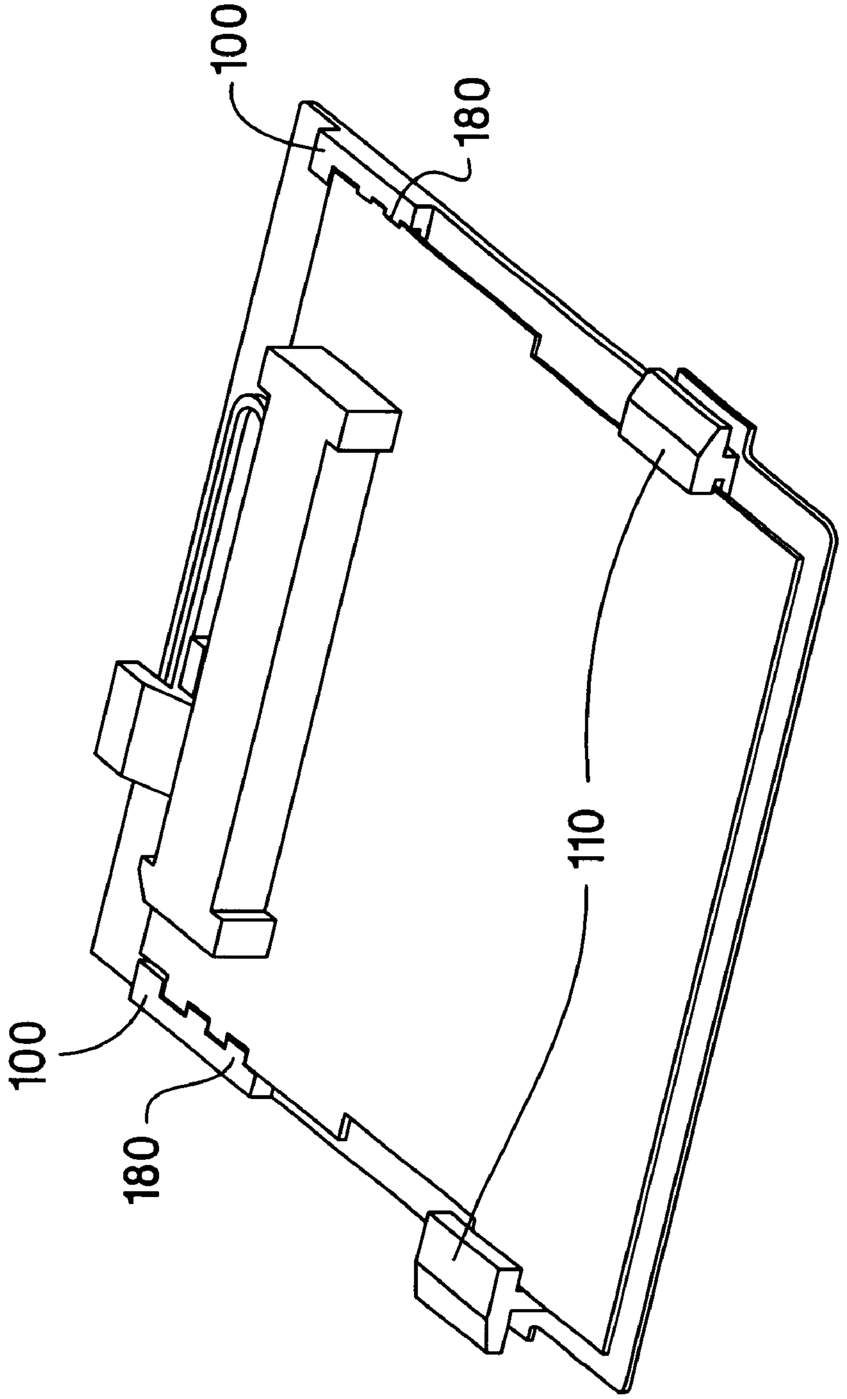
FIG. 6 is a perspective view of the housing cover and the expansion module of FIG. 5 in a coupled state.

The front longitudinal channels 105 of the housing cover 44 are blocked at the front end. This blockage prevents the PCB 31 from moving beyond a certain point. With the PCB 31 received at this point, however, the housing cover 44 and expansion module 30 are in a sub-assembly configuration required for insertion into the expansion slot 12. This sub-assembly configuration is shown in FIG. 6.

A retaining protrusion 180 is provided in each of the front channels 105 of the housing cover 44 for interacting with a retaining profile or indent 170 on the side of the PCB 31. In the sub-assembly configuration, each retaining protrusion 180 latches on to the indent 170 to ensure the engagement between the housing cover 44 and the PCB 31.

What is claimed is:

1. A computing device comprising:

a computer circuitry having a first electrical connector, an expansion module having a second electrical connector for connecting to the first electrical connector to make an electrical connection to the computer circuitry, a housing substantially enclosing the computer circuitry, the housing having a cover that is removable from and replaceable on the remainder of the housing, said cover being coupled to the expansion module so that removal of the cover separates the expansion module from the computer circuit, and replacement of the cover connects the first and second electrical connectors; wherein the housing is configured such that, mechanically assisted, said cover can be swung open from a locked position in which the expansion module is connected to the computer circuit and direct removal of the expansion module is prevented, to an unlocked position in which the expansion module is at least partly detached from the computer circuitry and may be further removed from the cover, and a locking means for removing and replacing the cover, the locking means being movable in a predetermined direction relative to the housing, having a rear portion and a front portion, wherein a part of the cover is locked between the rear portion and the front portion, the cover thereby being pushed out by the rear portion as the locking means is driven to move in a removal direction, while the cover being pushed back by the front portion as the locking means is driven to move in a replacement direction.

2. The computing device of claim 1, wherein the locking means further comprising a driven means through which the locking means is driven in the predetermined direction relative to the housing.

3. The computing device of claim 1, further comprising a cam with a screw head, wherein the cam is movable in a predetermined direction relative to the housing when the screw head is being rotated, the cover incorporating cam follower's profile at a first end of the cover such that the cover can be driven along with the movement of the cam.

4. The computing device of claim 3, wherein the cam provides the mechanic force for opening the cover.

5. The computing device of claim 3, wherein the cam has a helical profile.

6. The computing device of claim 3, wherein the cover is restricted from movement by the cam's profile when the expansion module has been secured.

* * * * *